(12) United States Patent
Diewald

(10) Patent No.: US 6,828,869 B2
(45) Date of Patent: Dec. 7, 2004

(54) CIRCUIT FOR TEMPERATURE DETERMINATION

(75) Inventor: Horst Diewald, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/077,248

(22) Filed: Feb. 15, 2002

(65) Prior Publication Data

US 2002/0118073 A1 Aug. 29, 2002

(51) Int. Cl.[7] .................................................. H03L 1/00
(52) U.S. Cl. .................... 331/176; 331/177 R; 327/512
(58) Field of Search .................. 327/146–150, 327/155–159, 512, 513; 331/2, 14, 16–18, 176, 175, 177 R, DIG. 2; 375/376

(56) References Cited

U.S. PATENT DOCUMENTS

| | | | | |
|---|---|---|---|---|
| 4,454,483 | A | * | 6/1984 | Baylor ........................ 331/11 |
| 5,216,389 | A | * | 6/1993 | Carralero et al. ............. 331/18 |
| 5,576,666 | A | * | 11/1996 | Rauvola ...................... 331/25 |
| 5,856,766 | A | * | 1/1999 | Gillig et al. ................. 331/176 |

FOREIGN PATENT DOCUMENTS

| | | |
|---|---|---|
| EP | 0 735 693 A1 | 10/1996 |
| EP | 0 753 726 A1 | 1/1997 |
| JP | 08056151 | 2/1996 |

OTHER PUBLICATIONS

Yoshihiko, "Voltage Controlled Ocsillation Circuit", Patent Abstracts of Japan, vol. 1996, No. 06, Jun. 28, 1996 & JP 08 056151 A (NEC Miyagi Ltd; Others:01), Feb. 27, 1996.

* cited by examiner

*Primary Examiner*—Minh Nguyen
(74) *Attorney, Agent, or Firm*—W. Daniel Swayze, Jr.; W. James Brady; Frederick J. Telecky, Jr.

(57) ABSTRACT

A circuit relates to phase and frequency-locked loop circuits (PLL and FLL circuits) with a controllable tracking oscillator whose signal phase relationship or frequency, respectively, is influenced by an external parameter, a reference oscillator, as well as a phase or frequency comparator, the output signal of which is used to control the tracking oscillator in such a way that any phase or frequency errors are reduced. A circuit provides for an element for the measurement of the external parameter (such as a microprocessor) which is capable of receiving a signal representing the output signal of the phase or frequency comparator, and convert it into a measurement value that represents the present value of the external parameter. This external parameter can, for example, represent the ambient temperature or the supply voltage of the tracking oscillator.

9 Claims, 1 Drawing Sheet

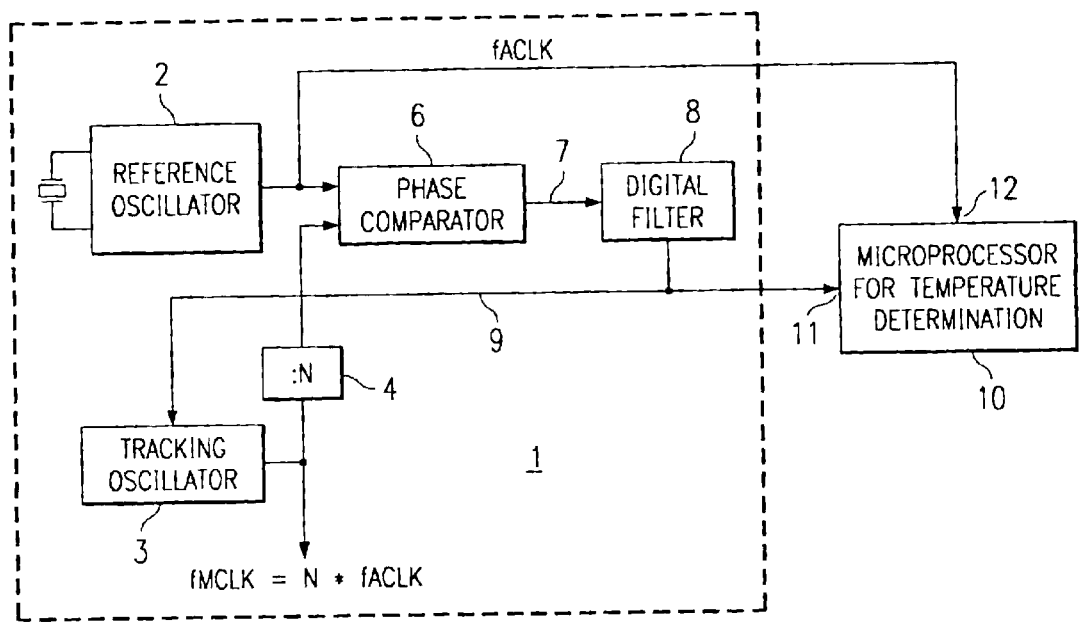

CIRCUIT FOR TEMPERATURE DETERMINATION

FIELD OF THE INVENTION

The invention relates to phase and frequency-locked loop circuits (PLL and FLL circuits).

BACKGROUND OF THE INVENTION

PLL and FLL circuits are at present finding a plurality of applications in electronic circuits for the purpose of synchronizing a frequency-controllable tracking oscillator (usually a voltage-controlled oscillator [VCO]) in either phase or frequency with the signal of a reference oscillator (such as a crystal-controlled oscillator), whose phase or frequency, respectively, is virtually constant in comparison with the voltage-controlled oscillator. The clock frequency generated by the tracking oscillator is thereby greater by a certain factor (such as 100) than the frequency of the reference oscillator, and is applied, via a frequency divider, to a phase or frequency comparator, respectively, which generates the signal for the control of the tracking oscillator. The output signal generated by the tracking oscillator can then, for example, be used as the system clock signal for a microprocessor.

Apart from the PLL and/or FLL circuits, nowadays a plurality of further circuit components, to fulfill a variety of functions, are generally also integrated on the same chip. These may, for example, include circuit components for the measurement of certain parameters, such as the ambient temperature or a changing supply voltage, and which make this information available to other circuit components for whose functioning this information is of significance.

The micro-electronics industry is constantly striving to make the best possible use of the space that is available on a microchip for the sum of the plurality of circuit components, and to reduce the size of these circuit components to the greatest possible extent. This requirement has not been met in the best possible way in previous circuits containing both a PLL or an FLL circuit, as well as circuits for the measurement of temperature and/or voltage, respectively.

SUMMARY OF THE INVENTION

The purpose of the present invention therefore is to provide a PLL or FLL circuit, respectively, in conjunction with a circuit for the measurement of specific parameters (such as temperature or supply voltage), that will use less circuit space than previous embodiment solutions, and that can also be produced more cost effectively.

This requirement is met by a phase-locked loop circuit (PLL circuit) in conjunction with a controllable tracking oscillator whose signal phase relationship is influenced by an external parameter, a reference oscillator whose signal phase relationship is constant, as well as a phase comparator to compare the phase relationship of the signal supplied by the tracking oscillator with the phase relationship of the signal supplied by the reference oscillator, and which supplies an output signal characteristic of the phase shift to the tracking oscillator, with which this will be controlled in such a way that phase errors are reduced, and where furthermore an element for the monitoring of the external parameter is provided which is conceived in such a way that it can receive a signal representing the output signal characteristic of the phase shift, and so change it into a measured value which represents the real value of the external parameter.

Furthermore, this requirement is also met by the use of a frequency-locked loop circuit (FLL circuit) in conjunction with a controllable tracking oscillator whose frequency is influenced by an external parameter, a reference oscillator whose frequency is constant, as well as a frequency comparator which compares the frequency of the signal supplied by the tracking oscillator with the frequency of the signal supplied by the reference oscillator, and which supplies an output signal characteristic of the frequency difference to the tracking oscillator, with which this will be controlled in such a way that frequency errors are reduced, and where furthermore an element for the monitoring of the external parameter is provided which is conceived in such a way that it can receive a signal representing the output signal characterizing the frequency shift, and so change it into a measured value which represents the real value of the external parameter.

The invention makes use of the fact that the level of the signal output by the phase/frequency comparator during the operation of a PLL or FLL control circuit, when the frequency of the tracking synchronizer is influenced by only one external parameter, such as the ambient temperature, characterizes this parameter, so that the measured value of the parameter, such as the ambient temperature, can be determined from this with the help of one further element. The invention therefore integrates the previously used circuit components for the parameter determination into the PLL or FLL circuit itself and thereby both reduces production costs as well as the requirement for circuit space as compared with conventional solutions.

The element used to measure the external parameter thereby preferably includes a microprocessor. If the tracking oscillator is used to supply the clock pulses for the microprocessor, there will be no need for any further circuit components to achieve phase or frequency tracking, as well as the determination of parameters, as compared with existing conventional methods. Advantageous further developments of the invention are designated in the subclaims.

BRIEF DESCRIPTION OF THE DRAWINGS

The invention shall now by explained in exemplified form with reference to the drawing, where FIG. 1 illustrates a PLL circuit, with a microprocessor for the determination of a temperature.

DETAILED DESCRIPTION OF THE DRAWINGS

The left-hand section of FIG. 1 here represents a conventional PLL circuit 1. This conventional PLL circuit 1 comprises a reference oscillator 2 which, in the present case, includes a crystal-controlled oscillator, and a controlled tracking oscillator 3 which, in the present case, is a digitally controlled oscillator (DCO).

The frequency fMCLK of the tracking oscillator 3 is greater by a factor N than the frequency fACLK of the reference oscillator 2. This will be adapted to the frequency of the reference oscillator 2 by means of a frequency divider 4 which is connected to the output of the tracking oscillator 3.

Provided is furthermore a phase comparator 6, whose first input is connected to the output of the reference oscillator and whose second input is connected to the output of the frequency divider, and which compares the phase of the signal from the reference oscillator with the phase of the signal from the frequency divider 4, and which outputs an output signal 7 that is characteristic of the phase shift between the two signals.

By means of a digital filter 8, connected to the output of the phase comparator 6, this output signal 7 is converted into a corresponding digital signal 9, for the purpose of controlling the controllable tracking oscillator 3 in such a way that the phase shift becomes zero, and whereby at the same time the condition fMCLK=N*fACLK is satisfied, that is the frequency of the tracking oscillator 3 then corresponds to the Nth multiple of the (constant) frequency of the reference oscillator 2.

Let it be assumed that the tracking oscillator 3 is embodied in such a way that changes of the frequency fMCLK that are not caused by the control signal 9 are essentially the result of influences by an external parameter. In the present example, this external parameter is assumed to be the ambient temperature T.

If the ambient temperature changes, this will cause a change of the frequency fMCLK of the tracking oscillator 3. This, in turn, causes a corresponding change in the level of the output signal 7 from the phase comparator 6, and therefore also of the output signal 9 of the digital filter 8, including the output signal in digital form. At the same rate as the temperature changes during the operation of the PLL circuit, there will be a corresponding change of the output signal from the phase comparator 6 or of the output signal 9 from the digital filter 9, characterizing this output signal in digital form, respectively.

This digital output signal 9 is now also applied to the signal input 11 of a microprocessor 10, which is embodied in such a way that it can determine the temperature from the signal characterized by the phase shift and, therefore, the temperature change.

The microprocessor 10 may, for example, keep a lookup table in its memory which stores the assignment of the digital values output by the digital filter with respect to the corresponding temperature values. With the help of this assignment system it becomes possible to determine on a continuous basis the actual present temperature value by comparing the digital values of the control signal 9, supplied to the signal input 11 of the microprocessor, with the values stored in the table.

In its preferred version, the microprocessor 10 has furthermore a clock input 12 at which the output signal of frequency fACLK, as supplied by the reference oscillator 2, is present. This is of advantage, since the temporal sequencing of the sampling of the temperature measurement values can be adapted to the corresponding phase comparator 6 and its time schedule at the delivery of the control signal 9. This means that a renewed sampling process of the temperature measurement value, for example, is only significantly indicated when a change of the digital control signal has just taken place. If the change of the digital control signal 9 is controlled by the signal of frequency fACLK, supplied by the reference oscillator 2, the temporal sequence of the sampling process of the temperature values is preferentially also controlled by means of this signal. This means that whenever, for example, the phase comparator 6 outputs a control signal 9 at the positive slope of the reference oscillator signal, a new sampling value for the determination of the temperature can be supplied to the microprocessor for evaluation.

In another embodiment of the invention, the clock signal of the reference oscillator can also be used as the microprocessor clock, so that there will be no need for the microprocessor 10 to have its own clock signal generator.

The precise determination of the temperature value can be by means of various different numerical methods, known in the context of mathematical statistics.

It is, for example, possible to store and accumulate a specific number of sampling values in succession at specified temporal intervals in the memory of the microprocessor 10, in order to compute a mean value of the temperature and, therefore, increase the precision of the measurement.

A sliding average value can also be obtained by replacing the latest value of the number of sampling values by the most recent sampling value.

The tracking synchronization circuit according to the invention is, of course, not limited to applications in PLL circuits, but can equally well be used with frequency tracking synchronization circuits, where a frequency comparator is provided instead of the phase comparator shown in FIG. 1.

It is, of course, not necessary either that the tracking oscillator should be embodied as a digitally controlled oscillator, but a conventional voltage controlled oscillator (VCO) can be used equally well.

The external parameter, from which the frequency (or phase, respectively) of the tracking oscillator depends, must not of necessity be represented by the ambient temperature either. It can, for example, also be the supply voltage for the tracking oscillator that essentially influences the frequency or the phase of the tracking oscillator. In such a case, the microprocessor represented in FIG. 1 would then supply a measurement value for the supply voltage of the tracking oscillator.

Even a digital filter does not, of course, constitute a necessary precondition. Conceivable is equally well an embodiment where an analogue signal, supplied by a low-pass filter, is digitized by an analogue-to-digital converter within the microprocessor.

It is, of course, also not necessary that the element for the measurement of the external parameter should consist of a microprocessor, but a logic circuit capable of generating a measurement value of the parameter from the control signal 9 would be equally suitable.

What is claimed is:

1. A phase locked loop (PLL) circuit comprising:
    a controllable digital tracking oscillator having a signal phase relationship dependent on an external parameter;
    reference oscillator generating a signal having a constant phase relationship;
    a phase comparator to compare the phase relationship of the signal supplied from said controllable tracking oscillator with the phase relationship of the signal supplied by the reference oscillator and outputs an output signal corresponding to the phase shift of the tracking oscillator;
    a circuit for monitoring the external parameter to receive a signal to represent a characteristic of the output signal of the phase shift; and
    a circuit to convert said signal to represent the characteristics of the output signal to a measured valued which represents the real value of the external parameter.

2. A phase lock loop circuit according to claim 1, where the external parameter is represented by the ambient temperature.

3. A phase lock loop circuit according to claim 1, where the external parameter is represented by the supply voltage of the digital tracking oscillator.

4. A phase lock loop circuit according to claim 1, where the circuit for the monitoring of the external parameter includes a microprocessor having a signal Input capable of receiving the signal representing the output signal characteristic of the phase shift.

5. A phase locked loop (PLL) circuit comprising:
- a controllable digital tracking oscillator having a digital signal being frequency dependent on an external parameter;
- reference oscillator having a constant frequency;
- a frequency comparator to compare the frequency of the signal supplied from said controllable tracking oscillator with the frequency of the signal supplied by the reference oscillator and outputs an output signal corresponding to the frequency difference to the tracking oscillator;
- a circuit for monitoring the external parameter to receive a signal to represent a characteristic of the output signal of the frequency difference; and
- a circuit to convert said signal to a measured valued which represents the real value of the external parameter.

6. A phase lock loop circuit according claim 5, wherein the frequency of the reference oscillator is lower than the fundamental frequency of the digital tracking oscillator, and where a frequency divider is provided between the output of the digital tracking oscillator and the input of the frequency comparator.

7. A phase lock loop circuit according to claim 5, where the external parameter is represented by the ambient temperature.

8. A phase lock loop circuit according to claim 5, where the external parameter is represented by the supply voltage of the digital tracking oscillator.

9. A phase lock loop circuit according to claim 5, where the circuit for the monitoring of the external parameter includes a microprocessor having a signal input capable of receiving the signal representing the output signal characteristic of the frequency shift.

* * * * *